United States Patent
Azadet et al.

(10) Patent No.: US 9,612,794 B2
(45) Date of Patent: Apr. 4, 2017

(54) COMBINED RF EQUALIZER AND I/Q IMBALANCE CORRECTION

(71) Applicant: Intel Corporation, Santa Clara, CA (US)

(72) Inventors: Kameran Azadet, San Ramon, CA (US); Joseph H. Othmer, Ocean, NJ (US); Meng-Lin Yu, Morganville, NJ (US)

(73) Assignee: Intel Corporation, Santa Clara, CA (US)

( * ) Notice: Subject to any disclaimer, the term of this patent is extended or adjusted under 35 U.S.C. 154(b) by 114 days.

(21) Appl. No.: 13/661,355

(22) Filed: Oct. 26, 2012

(65) Prior Publication Data

US 2013/0117342 A1  May 9, 2013

Related U.S. Application Data

(60) Provisional application No. 61/552,242, filed on Oct. 27, 2011.

(51) Int. Cl.
*H04B 1/04* (2006.01)
*H04L 1/00* (2006.01)
(Continued)

(52) U.S. Cl.
CPC .............. *G06F 5/01* (2013.01); *G06F 9/3001* (2013.01); *G06F 9/30036* (2013.01);
(Continued)

(58) Field of Classification Search
CPC . H03H 2017/0081; H04L 27/364; H04B 1/10
(Continued)

(56) References Cited

U.S. PATENT DOCUMENTS 7,167,513 B2   1/2007   Tsui et al.
7,336,730 B2   2/2008   Auranen et al.
(Continued)

FOREIGN PATENT DOCUMENTS

JP   2003298549 A   10/2003
JP   2009055558 A   3/2009
(Continued)

OTHER PUBLICATIONS

Li, Weiping, FIR Filtering Using Vector Transformation and Convolution Processor, 1990, IEEE, pp. 1223-1226.*
(Continued)

*Primary Examiner* — Andrew Caldwell
*Assistant Examiner* — Calvin M Brien
(74) *Attorney, Agent, or Firm* — Schwegman Lundberg & Woessner, P.A.

(57) ABSTRACT

Software implementations are provided for performing IQ imbalance correction and/or RF equalization. An input signal, x, is processed in software by executing a vector convolution instruction to apply the input signal, x, to a first complex FIR filter that performs one or more of RF equalization and IQ imbalance correction; and executing a vector convolution instruction to apply a conjugate x* of the input signal, x, to a second complex FIR filter that performs the one or more of RF equalization and IQ imbalance correction, wherein the second complex FIR filter is in parallel with the first complex FIR filter. The first and second complex FIR filters have complex coefficients and the input signal comprises a complex signal.

11 Claims, 3 Drawing Sheets

(51) Int. Cl.

| | |
|---|---|
| *H04B 1/62* | (2006.01) |
| *H04L 25/02* | (2006.01) |
| *H03F 1/32* | (2006.01) |
| *H04B 1/00* | (2006.01) |
| *G06F 5/01* | (2006.01) |
| *H04L 27/233* | (2006.01) |
| *G06F 9/30* | (2006.01) |
| *H04L 25/03* | (2006.01) |
| *H03M 3/00* | (2006.01) |
| *H03F 1/02* | (2006.01) |
| *H03F 3/189* | (2006.01) |
| *H03F 3/24* | (2006.01) |

(52) U.S. Cl.
CPC ......... *H03F 1/0288* (2013.01); *H03F 1/3241* (2013.01); *H03F 1/3258* (2013.01); *H03F 3/189* (2013.01); *H03F 3/24* (2013.01); *H03M 3/30* (2013.01); *H04B 1/0475* (2013.01); *H04B 1/62* (2013.01); *H04L 1/0054* (2013.01); *H04L 25/02* (2013.01); *H04L 25/03* (2013.01); *H04L 25/03178* (2013.01); *H04L 25/03216* (2013.01); *H04L 27/2334* (2013.01); *H03F 2200/336* (2013.01); *H03F 2201/3209* (2013.01); *H03F 2201/3212* (2013.01); *H03F 2201/3224* (2013.01); *H03F 2201/3233* (2013.01); *H04B 1/0003* (2013.01)

(58) Field of Classification Search
USPC .................................................. 708/300–323
See application file for complete search history.

(56) References Cited

U.S. PATENT DOCUMENTS

| | | | |
|---|---|---|---|
| 8,111,778 B2 | 2/2012 | Yano et al. | |
| 2001/0040930 A1* | 11/2001 | Abbey ................... | H03D 3/006 375/316 |
| 2002/0062436 A1* | 5/2002 | Van Hook et al. ........... | 712/210 |
| 2003/0112904 A1* | 6/2003 | Fuller et al. .................. | 375/350 |
| 2003/0231726 A1* | 12/2003 | Schuchert ......... | H04L 25/03159 375/350 |
| 2004/0180679 A1 | 9/2004 | Porter | |
| 2007/0060155 A1 | 3/2007 | Kahana et al. | |
| 2007/0140101 A1 | 6/2007 | Guo et al. | |
| 2007/0286122 A1 | 12/2007 | Fonseca | |
| 2008/0187057 A1 | 8/2008 | Qu | |
| 2008/0192860 A1 | 8/2008 | Harwood et al. | |
| 2014/0075162 A1 | 3/2014 | Azadet et al. | |
| 2014/0108477 A1 | 4/2014 | Azadet et al. | |

FOREIGN PATENT DOCUMENTS

| | | |
|---|---|---|
| WO | WO-2007068077 A1 | 6/2007 |
| WO | WO-2013049826 A1 | 4/2013 |
| WO | WO-2014071308 A1 | 5/2014 |

OTHER PUBLICATIONS

"U.S. Appl. No. 13/701,415, 3.12 Amendment mailed Feb. 4, 2015", 10 pgs.

"U.S. Appl. No. 13/701,415, Non Final Office Action mailed Aug. 1, 2013", 11 pgs.

"U.S. Appl. No. 13/701,415, Notice of Allowance mailed Nov. 20, 2014", 5 pgs.

"U.S. Appl. No. 13/701,415, Response filed Sep. 10, 2014 to Non Final Office Action mailed Aug. 1, 2013", 13 pgs.

"U.S. Appl. No. 13/701,415, USPTO Response to 3.12 Amendment mailed Feb. 4, 2015", 2 pgs.

"Chinese Application Serial No. 201280060978.6, Office Action mailed Sep. 18, 2016", W/ Machine Translation, 9 pgs.

"Chinese Application Serial No. 201280060978.6, Response filed Aug. 29, 2016 to Office Action mailed Apr. 15, 2016", W/ English Translation, 7 pgs.

"Japanese Application Serial No. 2014-539063, Office Action mailed Jun. 14, 2016", W/ English Translation, 5 pgs.

"Japanese Application Serial No. 2014-539063, Response filed Sep. 14, 2016 to Office Action mailed Jun. 14, 2016", W/ Machine Translation, 19 pgs.

Vegt, Rolf De, "802.11ax Spec Development Process Proposal", IEEE 802.11-14/0419r0 (Qaulcomm), (Mar. 14, 2014), Slide 1-10.

* cited by examiner

500

RF EQUALIZER / IQ IMBALANCE CORRECTION
LOAD INPUT DATA IN BUFFER X /* INPUT DATA IS TYPICALLY OUTPUT OF DPD FUNCTION */
LOAD COEFFICIENTS C(K), K=1 TO NUMBER_OF_FILTER_TAPS
APPLY FILTER C TO DATA X USING CONVOLUTION INSTRUCTION
STORE RESULT IN BUFFER Y
LOAD COEFFICIENTS D(K) K=1 TO NUMBER_OF_FILTER_TAPS
APPLY FILTER D TO DATA CONJ(X) USING CONVOLUTION INSTRUCTION AND ACCUMULATE WITH Y
STORE RESULTS IN BUFFER Y
STORE Y IN PROCESSOR'S VECTOR MEMORY

FIG. 5

COMBINED RF EQUALIZER AND I/Q IMBALANCE CORRECTION

CROSS-REFERENCE TO RELATED APPLICATIONS

The present application claims priority to U.S. Patent Provisional Application Ser. No. 61/552,242, filed Oct. 27, 2011, entitled "Software Digital Front End (SoftDFE) Signal Processing and Digital Radio," incorporated by reference herein.

The present application is related to U.S. patent application Ser. No. 13/701,397, entitled "Digital processor having instruction set with complex exponential non-linear function;" and U.S. patent application Ser. No. 13/701,376, entitled "Vector processor having instruction set with vector convolution function for fir filtering," each filed contemporaneously herewith and incorporated by reference herein.

FIELD OF THE INVENTION

The present invention is related to digital signal processing techniques and, more particularly, to techniques for addressing distortions in transmitted communication signals.

BACKGROUND OF THE INVENTION

A digital front end (DFE) is employed in communication devices to perform signal processing on transmitted and received signals. In the transmitter, for example, the DFE comprises the signal processing components that process the baseband signal in the digital domain and provide an up-converted digital signal to a digital-to-analog converter (DAC). The DFE in the transmitter typically includes, for example, components to perform RF equalization and I/Q imbalance correction.

Generally, the RF equalizer compensates for dispersion in the RF path (e.g., in PCB board traces and RF cables) and/or for the frequency dependent linear response of a power amplifier and other RF circuits in the transmitter chain. When a channel has been properly equalized, the frequency domain attributes of the signal at the input are reproduced at the output.

In a Quadrature Amplitude Modulation (QAM) communication system, the in-phase ("I") and quadrature ("Q") components of a signal identify a symbol being communicated. The IQ ratio is typically modulated by controlling the amplitudes of two sinusoids separated in phase by ninety degrees. An IQ imbalance is introduced when the two generated sinusoids are not perfectly matched in amplitude and orthogonal in phase, causing a received point to be mis-aligned with a constellation point corresponding to the desired symbol. A number of techniques have been proposed or suggested for correcting IQ imbalance. For example, U.S. Pat. Nos. 7,167,513 and 7,336,730 are directed to techniques for correcting IQ imbalance.

A digital front end is typically implemented using hard-wired logic due to the high sampling rates. IQ imbalance correction and RF equalization, for example, are typically performed using two separate hardware modules. While such hardware-based DFE techniques effectively process a communication signal, they suffer from a number of limitations, which if overcome, could further improve the efficiency and flexibility of DFE systems. For example, existing hardware-based DFE techniques lack flexibility and it is expensive, time consuming and challenging to modify the DFE design for a new RF design.

A need exists for software implementations of IQ imbalance correction and RF equalization.

SUMMARY OF THE INVENTION

Generally, software implementations are provided for performing IQ imbalance correction and/or RF equalization. According to one aspect of the invention, an input signal, x, is processed in software by executing a vector convolution instruction to apply the input signal, x, to a first complex FIR filter that performs one or more of RF equalization and IQ imbalance correction; and executing a vector convolution instruction to apply a conjugate x* of the input signal, x, to a second complex FIR filter that performs the one or more of RF equalization and IQ imbalance correction, wherein the second complex FIR filter is in parallel with the first complex FIR filter.

The first and second complex FIR filters have complex coefficients and the input signal comprises a complex signal. The first and second complex FIR filters can be defined by the following expressions:

$$y_{IQE,n} = \sum_{k=1}^{M} c_k \cdot x_{n-k} + \sum_{k=1}^{M} d_k \cdot x^*_{n-k}$$

where c comprises coefficients of the first complex FIR filter and d comprises coefficients of the second complex FIR filter.

A more complete understanding of the present invention, as well as further features and advantages of the present invention, will be obtained by reference to the following detailed description and drawings.

BRIEF DESCRIPTION OF THE DRAWINGS

FIG. 5 illustrates exemplary pseudo code for joint IQ imbalance correction and equalization.

DETAILED DESCRIPTION

Figure 1:
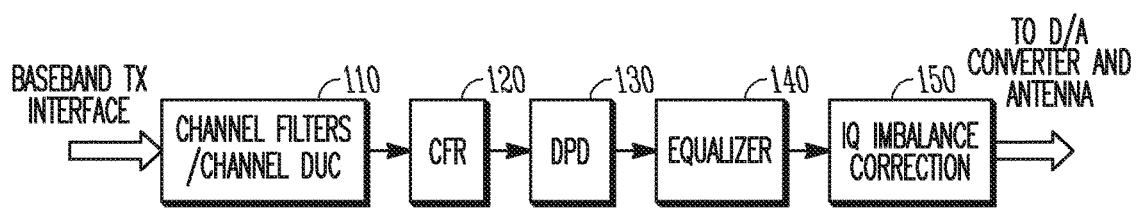
FIG. 1 illustrates portions of an exemplary transmitter in which aspects of the present invention may be employed.

FIG. 1 illustrates portions of an exemplary transmitter 100 in which aspects of the present invention may be employed. As shown in FIG. 1, the exemplary transmitter portion 100 comprises a channel filter and digital up conversion (DUC) stage 110, a crest factor reduction (CFR) stage 120, a digital pre-distortion (DPD) stage 130, an equalization stage 140 and an IQ Imbalance Correction stage 150. Generally, the channel filter and digital up conversion stage 110 performs channel filtering using, for example finite impulse response (FIR) filters and digital up conversion to convert a digitized baseband signal to an intermediate frequency (IF). As indicated above, the crest factor reduction stage 120 limits the peak-to-average ratio (PAR) of the transmitted signal. The digital pre-distortion stage 130 linearizes the power amplifier to improve efficiency. The equalization stage 140 employs RF channel equalization to mitigate channel impairments. The equalization stage 140 can be implemented, for example, as an FIR filter having 27 taps at a sampling rate of 307.2 MSPS.

The present invention can be applied in handsets, base stations and other network elements.

The IQ Imbalance Correction stage 150 corrects for amplitude and phase mismatch in an I/Q (in-phase/quadrature-phase) signal pair, to avoid unwanted spectral components at the negative signal frequency. For a more detailed discussion of IQ Imbalance Correction, see for example, Lei Ding et al., "Compensation of Frequency-Dependent Gain/Phase Imbalance in Predistortion Linearization Systems," IEEE Transactions on Circuits and Systems, Vol. 55, No. 1, 390-97 (February 2008), incorporated by reference herein.

As previously indicated, RF equalization 140 and IQ imbalance correction 150 are typically performed using two separate hardware modules (as shown in FIG. 1). Aspects of the present invention provide joint techniques for IQ imbalance correction and RF equalization.

IQ Imbalance Correction

IQ imbalance correction (without frequency dependence) is typically expressed as follows:

$$y=(\alpha_0 x_r+\alpha_1 x_i)+j(\alpha_2 x_r+\alpha_3 x_i) \quad (1)$$

where x is the input signal, and the α's are the IQ correction coefficients. Thus, IQ imbalance correction can be implemented using equation (1) as four real multipliers.

Equation (1) can be restated as two complex filters x and x*, where the expression x* indicates x indicates a conjunction of x. Thus, IQ imbalance correction also be computed (with frequency dependence) using complex multiplications, as follows:

$$\hat{y}=a \cdot x+b \cdot x^* \quad (2)$$

$$\hat{y}=((a_r+b_r)x_r-(a_i-b_i)x_i)+j((a_i+b_i)x_r-(a_r-b_r)x_i)$$

where:

$$a_r+b_r=\alpha_0$$

$$a_r-b_r=\alpha_3$$

$$a_i+b_i=\alpha_2$$

$$a_i-b_i=\alpha_1, \text{ and}$$

$$a_r=\frac{\alpha_0+\alpha_3}{2},$$

$$a_i=\frac{\alpha_2+\alpha_1}{2},$$

$$b_r=\frac{\alpha_0-\alpha_3}{2},$$

$$b_i=\frac{\alpha_2-\alpha_1}{2},$$

Thus, for the case of frequency-dependent IQ imbalance compensation, IQ imbalance correction can be implemented using equation (2) as real FIR filters. The exemplary IQ Imbalance Correction stage 150 can be embodied as an FIR filter having five taps at a sampling rate of 307.2 MSPS. The exemplary IQ Imbalance Correction stage 150 implements equation (2) using four real multiply-accumulate (MACs) operations per tap.

Figure 2:
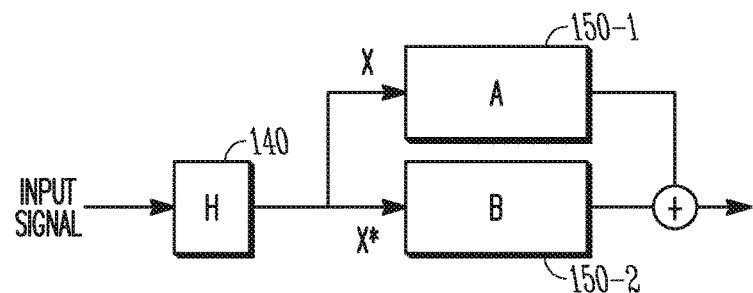
FIG. 2 illustrates an FIR filter implementation of the equalization stage and an IQ Imbalance Correction stage of FIG. 1.

FIG. 2 illustrates an FIR filter implementation of the equalization stage 140 and an IQ Imbalance Correction stage 150 of FIG. 1. As shown in FIG. 2, the IQ Imbalance Correction stage 150 of FIG. 1 can be implemented as two parallel FIR filters 150-1, 150-2 in accordance with equation (2) as follows:

$$y_{IQIC}(n)=\Sigma_{k=0}^{N-1}a_k x(n-k)+\Sigma_{k=0}^{N-1}b_k x^*(n-k). \quad (3)$$

Combined Equalization and IQ Imbalance Correction (IQE)

Figure 3:
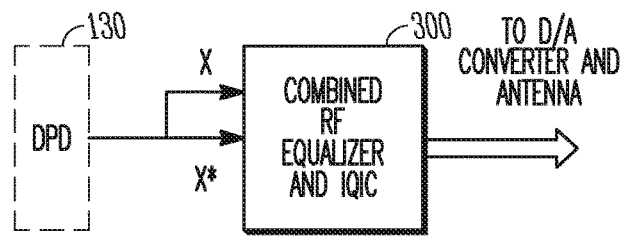
FIG. 3 illustrates portions of the exemplary transmitter of FIG. 1 in accordance with aspects of the invention.

FIG. 3 illustrates portions of the exemplary transmitter 100 of FIG. 1 in accordance with aspects of the invention. In FIG. 2, the digital pre-distortion (DPD) stage 130 is an optional element that can be omitted. As shown in FIG. 3, the independent equalization stage 140 and an IQ Imbalance Correction stage 150 from FIG. 1 have been combined into a single RF equalizer and IQ imbalance correction (IQIC) stage 300.

Figure 4:
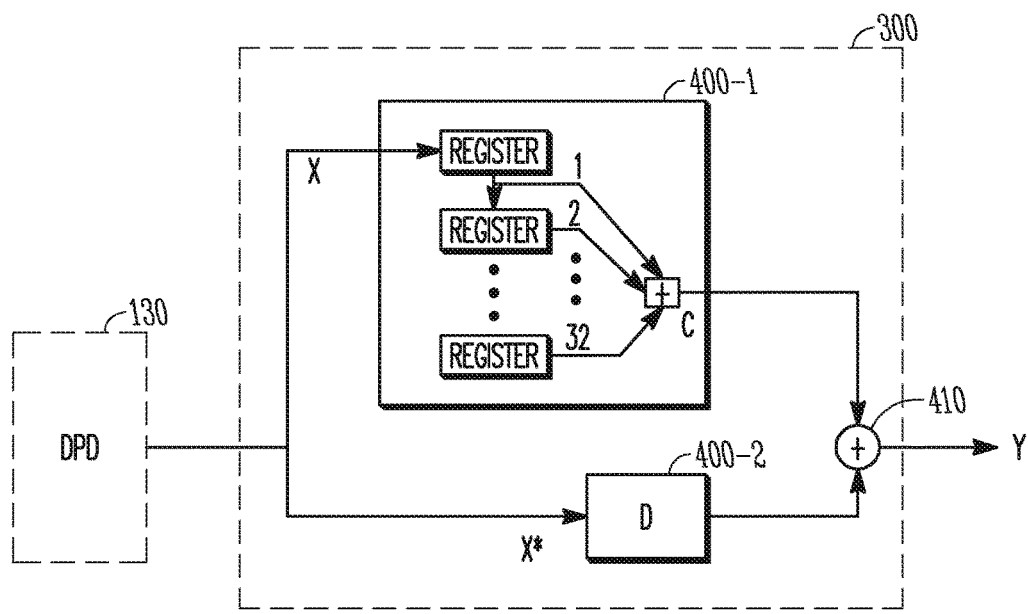
FIG. 4 illustrates an FIR filter implementation of the combined RF equalizer and IQ imbalance correction (IQIC) stage of FIG. 3.

FIG. 4 illustrates an FIR filter implementation of the combined RF equalizer and IQ imbalance correction (IQIC) stage 300 of FIG. 3. As shown in FIG. 4, the combined RF equalizer and IQ imbalance correction (IQIC) stage 300 can be implemented as two parallel FIR filters 400-1, 400-2 as follows:

$$y_{IQE,n}=\sum_{k=1}^{M} c_k \cdot x_{n-k}+\sum_{k=1}^{M} d_k \cdot x_{n-k}^* \quad (4)$$

where h if the impulse response of the equalizer, c is the convolution of a and h and d is the convolution of b and h.

For example, each FIR filter 400 can be implemented as an FIR filter having 32 taps at a sampling rate of 307.2 MSPS. The two parallel FIR filters 400-1, 400-2 can have complex inputs and complex coefficients. In the exemplary embodiment of FIG. 4, the input signal x is applied to the first FIR filter 400-1 and the conjugate x* of the input signal x is applied to the second FIR filter 400-2. Thus, IQ imbalance correction can be represented as 2 complex filters 400 with outputs combined by an adder 410. The equalizer 140 which precedes the IQ imbalance correction 150 in FIG. 1 can be combined with the IQ imbalance correction 150 by combining its impulse response with each of these two complex coefficient FIR filters.

Thus, frequency-dependent I/Q imbalance correction is performed using two FIR filters with input x and conjugate of x where x is the input to I/Q imbalance correction processing.

The combined RF equalizer and IQ imbalance correction (IQIC) stage 300 can be implemented in hardware or in software using a convolution instruction in a vector processor. For a more detailed discussion of a convolution instruction for a vector processor, see, for example, International Patent Application Serial No. PCT/US12/62182, entitled "Vector Processor Having Instruction Set With Vector Convolution Function for FIR Filtering," filed contemporaneously herewith and incorporated by reference herein. The vector processors described in International Application Serial No. PCT/US12/62182 provide an enhanced instruction set that supports vector convolution functions and have a vector architecture that processes one or more vector inputs each comprised of a plurality of real or complex scalar numbers that are processed in parallel. If the vector processor is processing software code that includes a predefined instruction keyword corresponding to a vector convolution function and the appropriate operands for the function (i.e., the input samples), the instruction decoder must trigger an appropriate vector convolution functional unit(s) that processes the vector convolution instruction.

FIG. 5 illustrates exemplary pseudo code 500 for joint IQ imbalance correction and equalization. The IQ imbalance correction portion is only used in zero-IF architectures, as would be apparent to a person of ordinary skill in the art. As shown in FIG. 5, the coefficients, c and d, are loaded into memory and the resultant filters are applied to the input data using the convolution function.

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. An apparatus of a user equipment (UE) comprising:
a digital front end arranged to perform signal processing on signals for transmission from the UE and received at the UE, the digital front end comprising:
a combined system comprising radio frequency (RF) equalizer circuitry and in-phase/quadrature-phase (IQ) imbalance correction (IQIC) stage circuitry in a single stage, the combined system implemented as a first and second complex finite impulse response (FIR) filter disposed in parallel and an adder to sum outputs of the first and second complex FIR filters, the first and second complex FIR filters respectively comprising coefficients c and d, where c is the convolution of a and h, and d is the convolution of b and h, h is an impulse response of the RF equalizer circuitry alone, and a and b are linear combinations of IQ correction coefficients of real and imaginary components of the IQIC stage circuitry alone, and an output of the combined system is:

$$y_{IQE,n} = f(x) = \sum_{k=1}^{M} c_k \cdot x_{n-k} + \sum_{k=1}^{M} d_k \cdot x_{n-k}^*$$

where M is a filter length of the first and second complex FIR filters and x, x* are complex conjugates of an input signal and are respectively supplied to the first and second complex FIR filter.

2. The apparatus of claim 1, wherein the digital front end further comprises:
a channel filter and digital up conversion (DUC) stage arranged to convert a baseband transmit signal to an intermediate frequency (IF) signal and filter the IF signal to produce a filtered IF signal; and
a crest factor reduction (CFR) stage arranged to limit a peak-to-average ratio of the filtered IF signal.

3. The apparatus of claim 2, wherein the digital front end further comprises:
a digital pre-distortion (DPD) stage arranged to linearize a signal from the CFR stage and provide an output to the combined system.

4. The apparatus of claim 1, further comprising:
an antenna configured to transmit the output of the combined system or receive an input signal to be supplied to the digital front end.

5. The apparatus of claim 1 wherein:
the first and second complex FIR filters comprise a plurality of taps at a sampling rate of 307.2 million samples per second (MSPS).

6. The apparatus of claim 5 wherein:
each tap implements f(x) using a plurality of multiply-accumulate (MAC) operations.

7. The apparatus of claim 6 wherein:
four MAC operations are used per tap.

8. The apparatus of claim 5 wherein:
each of the first and second complex FIR filters comprises 32 taps.

9. An apparatus comprising:
a digital front end arranged to perform signal processing on signals transmitted to user equipment (UE) and received from the UE, the digital front end comprising:
a combined system comprising radio frequency (RF) equalizer circuitry and in-phase/quadrature-phase (IQ) imbalance correction (IQIC) stage circuitry in a single stage, the combined system arranged to compensate for dispersion in a transmitter or receiver RF path and for a frequency dependent linear response of a power amplifier along the RF path and RF circuits in a transmitter chain and arranged to compensate for an imbalance between an IQ ratio of an input RF signal, the combined system comprising a plurality of parallel finite impulse response (FIR) filters whose outputs are combined to provide a combined output, the first and second FIR filters respectively comprising coefficients that are different convolutions of an impulse response of the RF equalizer circuitry alone and linear combinations of IQ correction coefficients of real and imaginary components of the IQIC stage circuitry alone, and the combined output is:

$$y_{IQE,n} = f(x) = \sum_{k=1}^{M} c_k \cdot x_{n-k} + \sum_{k=1}^{M} d_k \cdot x_{n-k}^*$$

where M is a filter length of the first and second complex FIR filters and x, x* are complex conjugates of the input RF signal and are respectively supplied to the first and second complex FIR filter, and c and d are respectively the first and second FIR filter components.

10. The apparatus of claim 9, wherein the digital front end further comprises:
a channel filter and digital up conversion (DUC) stage arranged to upconvert a baseband transmit signal and filter the upconverted signal to produce a filtered signal; and
a crest factor reduction (CFR) stage arranged to limit a peak-to-average ratio of the filtered signal.

11. The apparatus of claim 10, wherein the digital front end further comprises:
a digital pre-distortion (DPD) stage arranged to linearize a signal from the CFR stage and provide an output to the combined system.

* * * * *